(12) United States Patent
Dangel et al.

(10) Patent No.: US 9,791,642 B2
(45) Date of Patent: Oct. 17, 2017

(54) PASSIVE ALIGNMENT OF POLYMER WAVEGUIDES

(71) Applicant: International Business Machines Corporation, Armonk, NY (US)

(72) Inventors: Roger F. Dangel, Zug (CH); Daniel S. Jubin, Langnau am Albis (CH); Antonio La Porta, Kilchberg (CH); Bert J. Offrein, Schoenenberg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/436,934

(22) Filed: Feb. 20, 2017

(65) Prior Publication Data
US 2017/0160472 A1   Jun. 8, 2017

Related U.S. Application Data

(63) Continuation of application No. 14/848,585, filed on Sep. 9, 2015.

(51) Int. Cl.
  *G02B 6/26* (2006.01)
  *G02B 6/42* (2006.01)
  *G02B 6/12* (2006.01)

(52) U.S. Cl.
  CPC ......... *G02B 6/4228* (2013.01); *G02B 6/4257* (2013.01); *G02B 2006/12147* (2013.01);
  (Continued)

(58) Field of Classification Search
  CPC .. G02B 6/4228; G02B 6/4236; G02B 6/4244; G02B 6/4245; G02B 6/4257;
  (Continued)

(56) References Cited

U.S. PATENT DOCUMENTS

| 5,273,553 | A | 12/1993 | Hoshi et al. |
| 6,974,714 | B2 * | 12/2005 | Uno ........................ G02B 6/136 438/31 |

(Continued)

OTHER PUBLICATIONS

Barwicz et al., "Assembly of Mechanically Compliant Interfaces between Optical Fibers and Nanophotonic Chips", 2014 Electronic Components & Technology Conference, ©2014 IEEE, pp. 179-185.
(Continued)

*Primary Examiner* — Robert Tavlykaev
(74) *Attorney, Agent, or Firm* — Steven F. McDaniel

(57) ABSTRACT

A chip packaging includes a first part comprising a support; and a core polymer layer transversally structured so as to exhibit distinct residual portions comprising: first waveguide cores each having a first height and disposed within said inner region; and one or more first alignment structures disposed within said outer region. A second part of the packaging comprises: second waveguide cores, each having a same second height; and one or more second alignment structures complementarily shaped with respect to the one or more first alignment structures, and wherein, the first part structured such that said inner region is recessed with respect to the outer region, to enable: the second waveguide cores to contact the first waveguide cores; and the one or more second alignment structures to respectively receive, at least partly, the one or more first alignment structures. The invention is further directed to related passive alignment methods.

4 Claims, 6 Drawing Sheets

(52) U.S. Cl.
CPC ........... *H01L 2224/08145* (2013.01); *H01L 2224/08238* (2013.01)

(58) Field of Classification Search
CPC ........... H01L 2224/08111–2224/08113; H01L 2224/08135; H01L 2224/08145; H01L 2224/08147; H01L 2224/08148; H01L 2224/08225; H01L 2224/08237; H01L 2224/08238; H01L 2224/30; H01L 2224/3001; H01L 2224/83345; H01L 21/2007
USPC ........... 385/50, 52, 42, 30; 438/455, 457, 31
See application file for complete search history.

(56) References Cited

U.S. PATENT DOCUMENTS

| | | | |
|---|---|---|---|
| 7,085,453 B2 * | 8/2006 | Nagai | G02B 6/12002 385/28 |
| 7,095,920 B1 * | 8/2006 | Little | G02B 6/12002 385/131 |
| 7,469,084 B2 * | 12/2008 | Aalto | G02B 6/125 385/130 |
| 7,885,499 B2 | 2/2011 | Blauvelt et al. | |
| 8,548,287 B2 | 10/2013 | Thacker et al. | |
| 2001/0055447 A1 | 12/2001 | Delprat et al. | |
| 2003/0215189 A1 * | 11/2003 | Lee | G02B 6/2813 385/50 |
| 2012/0093456 A1 | 4/2012 | Taillaert et al. | |
| 2013/0230274 A1 | 9/2013 | Fish | |
| 2014/0029888 A1 | 1/2014 | La Porta et al. | |
| 2014/0319656 A1 | 10/2014 | Marchena et al. | |
| 2015/0214082 A1 | 7/2015 | Huang et al. | |
| 2015/0357226 A1 | 12/2015 | Liu et al. | |

OTHER PUBLICATIONS

Hsu et al., "Low Power Penalty, Dry-Film Polymer Waveguides for Silicon Photonics Chip Packaging", ©2014 IEEE, pp. 19-22.
Panepucci et al., "Flexible Waveguide Probe for Silicon-Photonics Wafer-Level Test", ©2011 IEEE, pp. 111-113.
Soganci et al., "Flip-chip optical couplers with scalable I/O count for silicon photonics", published Jun. 27, 2013 (C)2013 OSA, Jul. 1, 2013, vol. 21, No. 13, DOI:10:1364/OE.21.016075, Optics Express 16075, pp. 1-11.
Zeng et al., "10-Gbit/s On-chip Optical Interconnect Module Using Silicon-Based 45° Micro-Reflectors Terminated Polymer Waveguides", 18th Microoptics Conference (MOC '13), Tokyo, Japan, Oct. 27-30, 2013, © 2013 The Japan Society of Applied Physics, pp. 1-2.
Dangel et al., "Passive Alignment of Polymer Waveguides", U.S. Appl. No. 14/848,585, filed Sep. 9, 2015, 27 pages.
IBM Appendix P, list of patents and patent applications treated as related, Feb. 20, 2017, 2 pages.
Brooks, Christopher, "Vertically-Integrated Photonic Devices in Silicon-on-Insulator", A Thesis Submitted to the School of Graduate Studies in Partial Fulfilment of the Requirements for the Degree Doctor of Philosophy, McMaster University, ©Copyright by Christopher Brooks, 2010, 217 pages.
Jiang et al., "A novel method for nanoprecision alignment in wafer bonding applications", IOP Publishing, Journal of Micromechanics and Microengineering, vol. 17, © 2007 IOP Publishing Ltd, 8 pages.

* cited by examiner

PASSIVE ALIGNMENT OF POLYMER WAVEGUIDES

BACKGROUND

The invention relates in general to the field of chip packaging, and in particular to methods for passive alignment of components of silicon photonics chips.

The optical coupling of light signals from/to photonic waveguides is an issue for optoelectronic (OE) chip packaging. High optical coupling efficiency, easy and low-cost OE chip assembly processes are often important requirements of such packaging. Another requirement is the integration of photonics with electronics, to further the scale of the off-chip Input/Output (I/O) bandwidth, while keeping low cost, area and power consumption. Silicon photonics in silicon-on-insulator (SOI) technology enables simultaneous realization of electrical and optical functions on the same chip.

Polymer waveguide (PWG) technology is known to provide satisfactory coupling into standard optical fibers. SOI and PWG cores are typically brought in contact and aligned horizontally.

SUMMARY

According to a first aspect, the present invention is embodied as chip packaging. The packaging comprises two parts, i.e., a first part and a second part. The first part comprises: a support (e.g., substrate or superstrate); and a core polymer layer extending over an inner region and an outer region of the support. The core polymer layer is transversally structured so as to exhibit distinct residual portions, each having a same first height. This first height corresponds to a thickness of the core polymer layer. The residual portion comprises: first waveguide cores disposed within said inner region; and one or more first alignment structures disposed within said outer region. The second part comprises: second waveguide cores, each having a same second height; and one or more second alignment structures complementarily shaped with respect to the one or more first alignment structures. The first part structured such that said inner region is recessed with respect to the outer region. Thus, the second waveguide cores may contact the first waveguide cores, while the one or more second alignment structures respectively receive, at least partly, the one or more first alignment structures.

The above packaging uses polymer alignment features as alignment features for the upper part. Due to the recess between the inner and outer regions, a satisfactory contact between the upper and lower waveguide cores can be achieved even if the first alignment features have a same (or even smaller) height as the first waveguide cores. In other words, the above solution provides a satisfactory passive alignment of the two parts, without requiring to pattern additional mechanical alignment structures on the lower part. The desired alignment accuracy is obtained via the second alignment structures, which are complementarily shaped with respect to the first structures.

Two types of chip packaging are notably proposed. In a first type, a deformability property of the support is exploited to create the recess, whereas the second type does not presume deformable supports.

Two classes of passive alignment methods for passively aligning chip packaging parts are accordingly proposed, which imply distinct fabrication processes for chip packaging. These two classes of passive alignment methods are briefly described below.

First, and according to another aspect, a passive alignment method comprises providing a first part and a second part of a chip packaging, where the first part comprises a deformable support and a core polymer layer as discussed above. Namely, the core polymer layer extends over an inner region and an outer region of the deformable support. This core polymer layer is furthermore transversally structured so as to exhibit distinct residual portions, each having a same first height, which corresponds to a thickness of the core polymer layer. The residual portions comprise: first waveguide cores disposed within said inner region; and one or more first alignment structures disposed within said outer region. The second part comprises: second waveguide cores, each having a same second height; and one or more second alignment structures complementarily shaped with respect to the one or more first alignment structures. The method further comprises a step of shaping the deformable support such that the inner region be recessed with respect to the outer region. Finally, the first part and the second part are brought together such that: the second waveguide cores respectively contact the first waveguide cores; and the one or more second alignment structures respectively receive, at least partly, the one or more first alignment structures.

Second, and according to a further aspect, another passive alignment method, which does not necessarily require a deformable (e.g., a flexible) support, comprises providing two parts, a first part and a second part of a chip packaging, wherein: the first part comprises: a support; and a core polymer layer extending over an inner region and an outer region of the support, the core polymer layer transversally structured so as to exhibit distinct residual portions, each having a same first height, which corresponds to a thickness of the core polymer layer. The residual portions comprise: first waveguide cores disposed within said inner region; and one or more first alignment structures disposed within said outer region. The second part comprises: second waveguide cores, each having a same second height; and one or more second alignment structures complementarily shaped with respect to the one or more first alignment structures. The first part is structured such that the inner region is recessed with respect to the outer region, to enable the second waveguide cores to contact the first waveguide cores and the one or more second alignment structures to respectively receive, at least partly, the one or more first alignment structures, to enable a passive alignment of the two parts. Then, the first part and the second part can be brought together, such that the second waveguide cores respectively contact the first waveguide cores and the one or more second alignment structures respectively receive, at least partly, the one or more first alignment structures.

The above passive alignment methods provide similar advantages as discussed above. Notably, they enable for a satisfactory passive alignment of the two parts, without requiring to pattern additional mechanical alignment structures on the lower part.

Devices and passive alignment methods embodying the present invention will now be described, by way of non-limiting examples, and in reference to the accompanying drawings. Technical features depicted in the drawings are not necessarily to scale.

BRIEF DESCRIPTION OF THE DRAWINGS

FIGS. 1-4 correspond to distinct embodiments of packaging and corresponding alignment methods. However, FIGS. 1-3 can be regarded as instances of a first class of alignment methods, whereas FIG. 4 reflects a second class of methods;

DETAILED DESCRIPTION OF EMBODIMENTS OF THE INVENTION

Known passive alignment methods fail to provide very accurate alignments of photonics chip components. In principle, mechanical features may be patterned directly in the polymer waveguide (PWG) core layer of the PWG support of the chip. Similarly, the silicon photonics chip (top component) may be structured to provide complementarily shaped alignment structures, to ensure sufficient alignment accuracy. However, and as it may be realized, the PWG core layer is, in practice, too thin to ensure a satisfactory mechanical coupling. In particular, mechanical structures patterned directly in the PWG core layer do not protrude sufficiently to ensure satisfactory mechanical coupling.

Present inventors have therefore considered the possibility to use visual (i.e., active) alignment with core polymer alignment markers. In that case, the alignment of the SOI waveguides relative to the PWGs can be done by visually aligning dedicated markers realized in the SOI layer with respect to suitable complementary markers made in the PWG core layer. However, the resulting alignment accuracy is limited by the resolution of the vision system and the accuracy of the positioning tool. Such an approach is also time-consuming and cost-intensive.

Thus, present inventors have considered the possibility of a passive alignment using cladding polymer alignment structures. Namely, the alignment of the SOI waveguides relative to the PWGs may be done by snapping patterned cladding polymer alignment structures into suitable complementary alignment structures realized in the buried oxide and Si handle. However, the polymer core and cladding alignment structures are typically realized in consecutive photo-lithographical patterning steps. Hence, the alignment accuracy is limited by the overlay positioning and dimension accuracy of the cladding alignment structures with respect to the PWGs.

Therefore, present inventors devised new passive alignment methods and chip packaging, which make it possible to achieve accurate chip-to-PWG alignment, e.g., to enable adiabatic coupling, through mechanical features pre-formed on components of the chip.

In reference to FIGS. 1-4, an aspect of the invention is first described, which concerns various embodiments of chip packaging (respectively denoted by numeral references 1, 1a, 1b and 1c in FIGS. 1-4). Generally, each chip packaging comprises a first (lower) part 10 and a second (upper) part 20.

Figure 3:
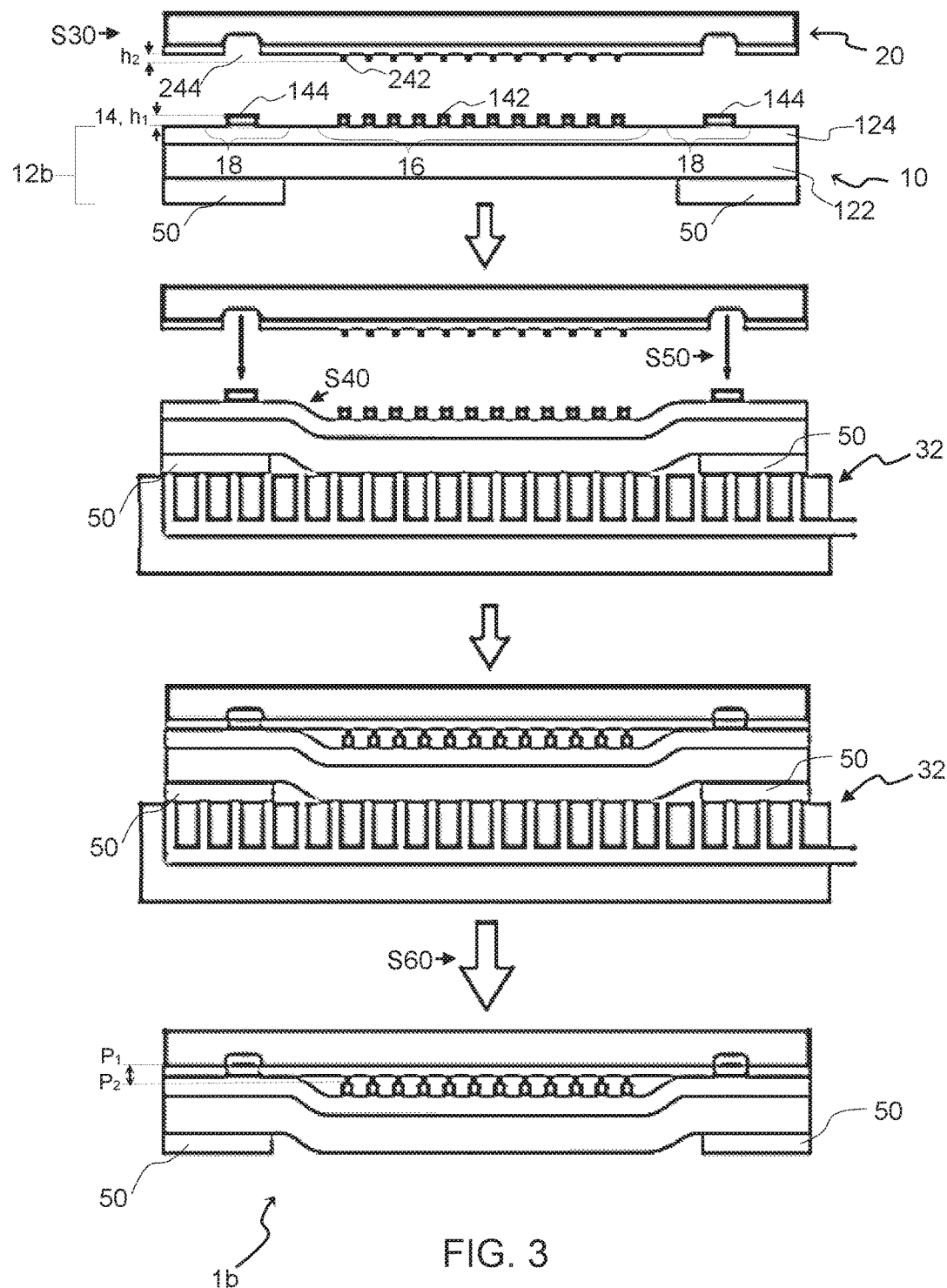
Figure 4:
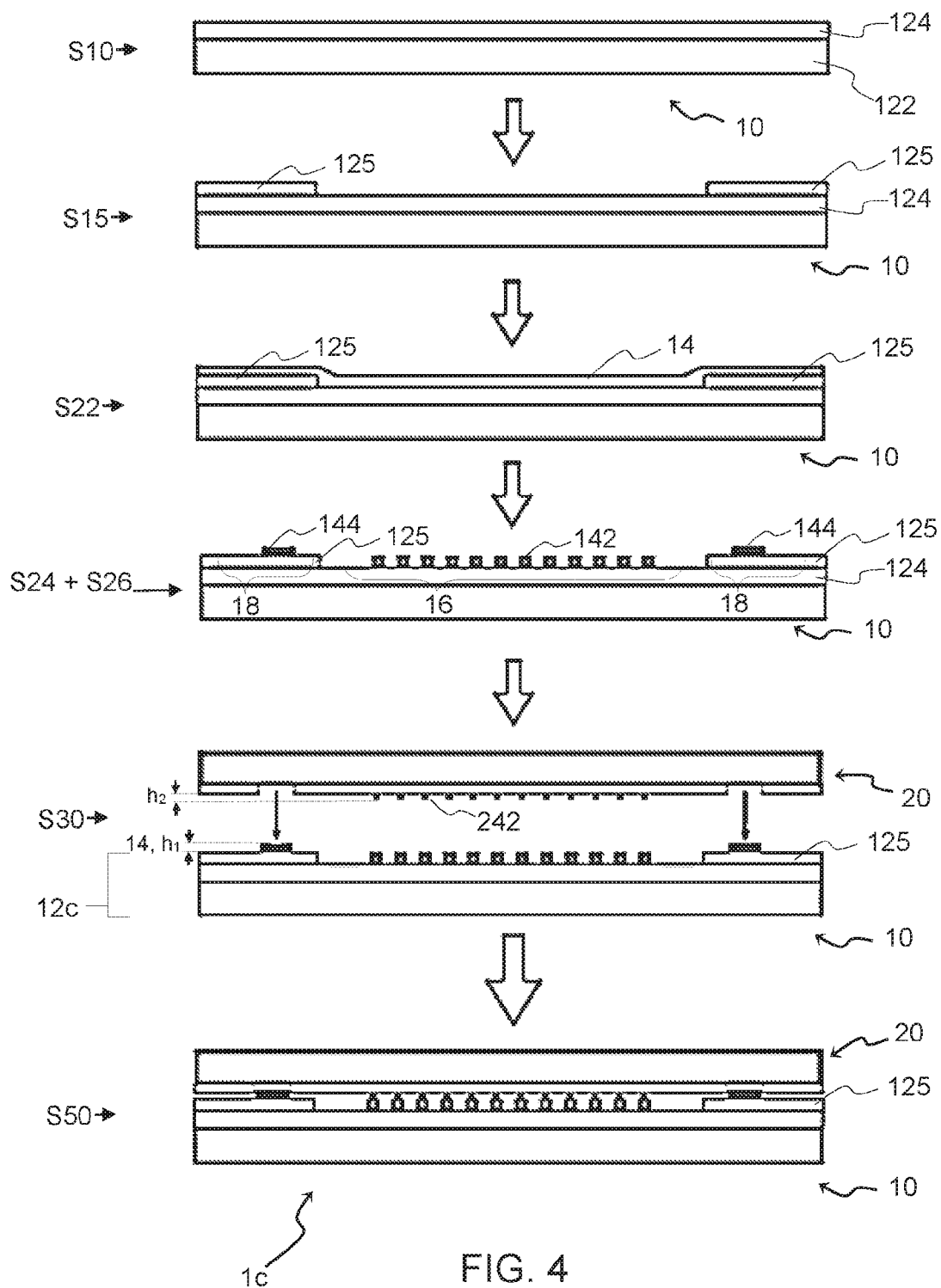

The first part 10 comprises a support (e.g., substrate or superstrate) 12 (FIGS. 1 and 2), 12b (FIG. 3) and 12c (FIG. 4). It further comprises a core polymer layer 14, which extends over both an inner region 16 and an outer region 18 of the support. The outer region typically surrounds (at least partly) the inner region. The core polymer layer 14 is transversally structured so as to exhibit distinct residual portions 142, 144. As the residual portions are structured within the same layer 14, they exhibit, each, a same height $h_1$ ("first height"), i.e., corresponding to the thickness of the core polymer layer 14. The residual portions comprise two groups of features. The first group consists of waveguide cores 142 (also referred to as "first waveguide cores" herein), arranged in the inner region 16. The second group comprises one or more alignment structures 144 ("first alignment structures"), arranged in the outer region 18.

The second part 20 comprises second waveguide cores 242, each having a same height $h_2$ ("second height"). It further comprises one or more second alignment structures 244, which are complementarily shaped with respect to the one or more first alignment structures 144. The waveguides cores 142, 144 and the alignment structures 144, 244 are typically longitudinally shaped (in a direction perpendicular to the section plane of FIGS. 1-4).

The first part 10 is furthermore structured such that the inner region 16 is recessed with respect to the outer region 18. This way, upon assembling the two parts 10, 20, the second waveguide cores 242 may come in contact with the first waveguide cores 142, whereas the second alignment structures 244 may respectively receive (at least partly) the first alignment structures 144, as depicted in FIGS. 1-4.

The first waveguide cores 142 preferably extend parallel to each other and the second waveguide cores 242 extend parallel to each other. The waveguide core structures 142 preferably extend parallel to the respective core structures 242, to enable a longitudinal contact. Similarly, each of the first alignment structures 144 may be longitudinal structures meant to insert (at least partly) into respective (second) alignment structures 244.

The above structure uses the polymer alignment features 144 directly as alignment features for the upper part 20. Due to the recess, a satisfactory contact between the upper and lower waveguide cores can be achieved even if the alignment features 144 (which are preferably fabricated during a same fabrication step as the waveguide cores 142) have a same (or even smaller) height as the waveguide cores 142. In other words, the above solution provides a satisfactory passive alignment of the two parts 10, 20, without requiring to pattern additional mechanical alignment structures on the lower part. The desired alignment accuracy is obtained via the second alignment structures 244, which are complementarily shaped with respect to the first structures 144.

The above concept can advantageously be applied to optoelectronic chip packaging and, in particular, to silicon photonics chip packaging.

In this respect, in embodiments, the second part 20 is a silicon photonics chip and the second waveguide cores 242 are silicon-on-insulator (SOI) waveguide cores. The second part 20 preferably comprises a silicon support 22 with a buried oxide layer 24. In the SOI wafer layer stack, the silicon support is often referred to as a "silicon handle".

Figure 1:
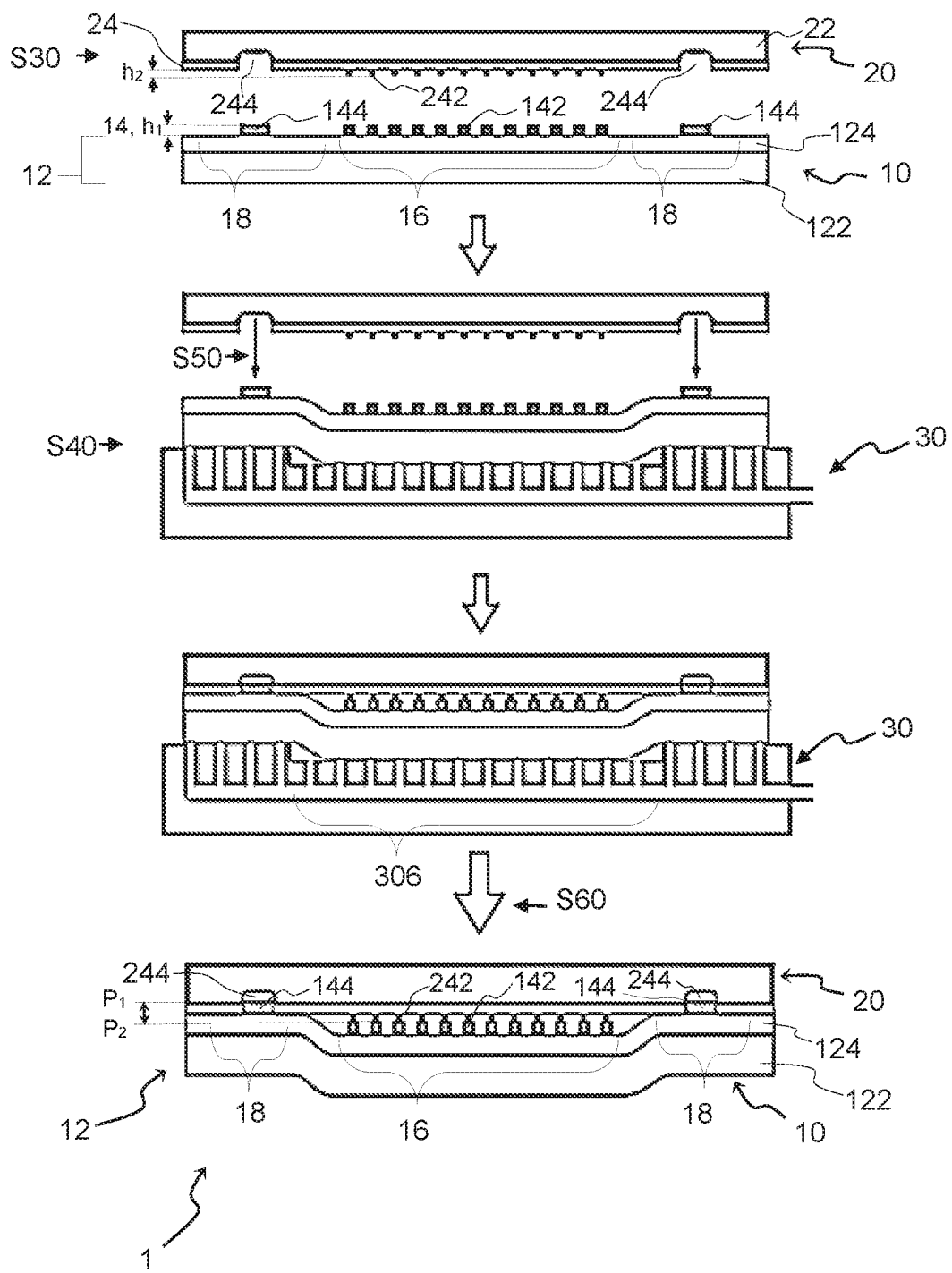
FIGS. 1-4 depict 2D (sectional) views of (a simplified representation of) chip packaging at various stages of their fabrication.
Figure 2:
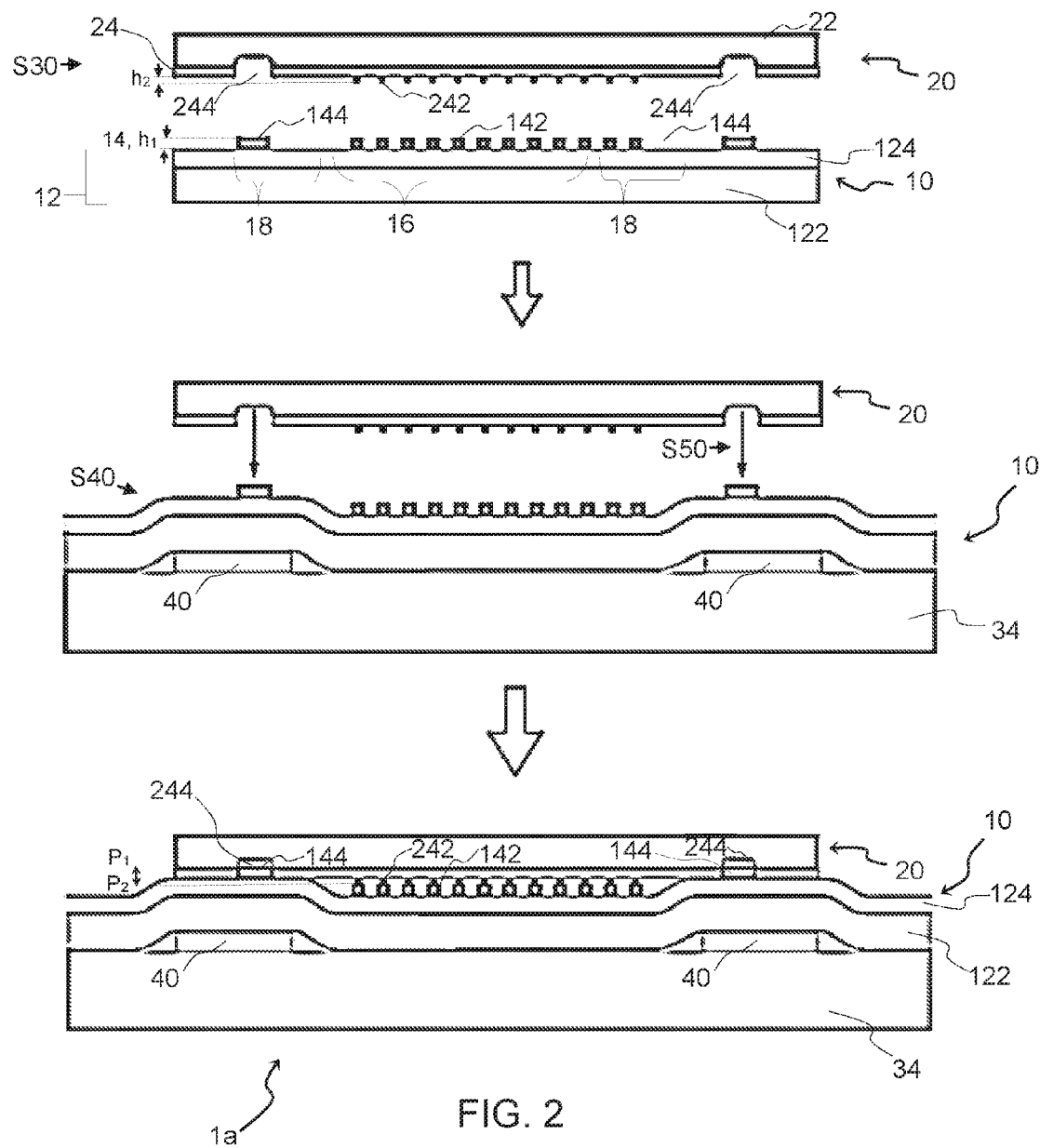

The support can be deformable (e.g., flexible), as in the embodiments of FIGS. 1-3. Should the support be rigid or non-easily malleable, or deformable, then additional cladding portions 125 may be used, to obtain a recess, as illustrated in FIG. 4. Subject to minor variations stemming from their different fabrication processes, the devices 1, 1a, 1b obtained at the end of the processes illustrated in FIGS. 1-3 are essentially similar, whereas the device 1c obtained from the fabrication method of FIG. 4 shows additional cladding portions 125.

The support 12, 12b-c may for instance comprise a support 122 and a polymer cladding layer 124 extending over the support 122, with the inner region 16 defined on the polymer cladding layer 124, as depicted in FIGS. 1-4.

Notwithstanding the depictions in the appended drawings, the space between consecutive pairs of waveguide cores of either sets 142 or 242 may be filled, e.g., with a polymer cladding, an oxide (using, e.g., shallow trench isolation) or, more generally, any filling material having a lower refractive index than the core material it bridges. The filling material made be made (at most) level with the waveguide cores, i.e., it will not protrude from the edge plane of the cores, such that an accurate passive alignment and a good contact between the features 142 and 242 can still be ensured, due to the present concepts.

Suitable materials for the cores 142, 144 and for the cladding polymer can for instance be polymer materials. They can notably be chosen among the following materials: an organo-silicon compound (e.g., silsesquioxane or polydimethylsiloxane), an organic-inorganic hybrid polymer (e.g., Ormocer®), a perfluoropolymer, an acrylate, a polyurethane, and a fluorinated polyimide. These examples are not limitative. Combinations of materials can be contemplated, if necessary. Different materials can be used for the cores 142, 144 and for the cladding polymer. If necessary, such materials can be chemically formulated and functionalized to provide one or more of the following properties: low optical absorption, environmental and thermal stability, and micro-manufacturabilty.

In embodiments such as depicted in FIGS. 1-4, the chip packaging uses two alignment structures 144 and, correspondingly, two second alignment structures 244, to ensure a good contact and, notably, parallelism of the contacting structures 142, 242. The structures 144 may for instance be snapped into their counterpart structures 244 (similarly as sockets or snap fasteners). More than two alignment structures may be used, but doing so may lead to buttressing issues or undesired material stress.

As mentioned earlier, the chip packaging is preferably a silicon photonics chip packaging, the part 20 being a silicon photonics chip comprising a silicon support 22 covered with a buried oxide layer 24. The second alignment structures 244 may, in that respect, be provided as cavities open at the level of the buried oxide layer 24 and extending into a thickness of the silicon support 22.

Referring now more specifically to the embodiments of FIGS. 1-3, the first part 10 may be structured such that a top surface of the one or more first alignment structures 144 lies in a first plane P1. Meanwhile, a top surface of the first waveguide cores 142 lies in a second plane P2, essentially parallel to the first plane. The two planes are at a distance from each other, which distance is larger than the sum of the height of the structures 142 and the height of the structures 144. This way, the second waveguide cores 242 may contact the first waveguide cores 142, while the second alignment structures 244 may receive (at least partly) the first alignment structures 144. Said distance may be adjusted by trial and error, so as to ensure a good alignment of structures 144 within their counterparts 244.

In the embodiments of FIGS. 1-3, the support 12, 12*b* is deformable (e.g., flexible or otherwise malleable), so as to be able to shape the support, whereby the inner region 16 may be recessed with respect to the outer region 18. To that aim, the support layer 122 of the support 12, 12*b* and, more generally, all layers 122, 124 may be deformable (or flexible) layers. Note that the polymer layers 14, 124 shall normally be flexible enough, owing to the layer thicknesses usually considered in the present technical field. Also, the core polymer layer 14 extends over the polymer cladding layer 124, with the inner and outer regions 16, 18 defined, each, directly on the polymer cladding layer 124.

Referring now to FIG. 4: instead of shaping the support, an essentially flat support 12*c* may be used, with one or more additional polymer cladding portions 125 extending over the polymer cladding layer 124, at the level of the outer region 18. I.e., the outer region 18 is then defined on the additional polymer cladding portions 125, such that the inner region 16 is recessed with respect to the outer region 18. This contrasts with the embodiments of FIGS. 1-3, where both the inner region 16 and the outer region 18 are defined directly on the polymer cladding layer 124. Instead, in FIG. 4, the outer region 18 is defined on the additional polymer cladding portions 125. Although this saves a process step for shaping the support, embodiments such as depicted in FIG. 4 require additional fabrication steps to obtain the additional portions 125.

Figure 5:
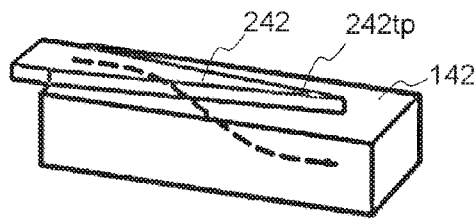
FIG. 5 is a 3D view of a simplified representation of an adiabatic optical coupling between an SOI waveguide and a polymer waveguide, as involved in embodiments.
Figure 6:
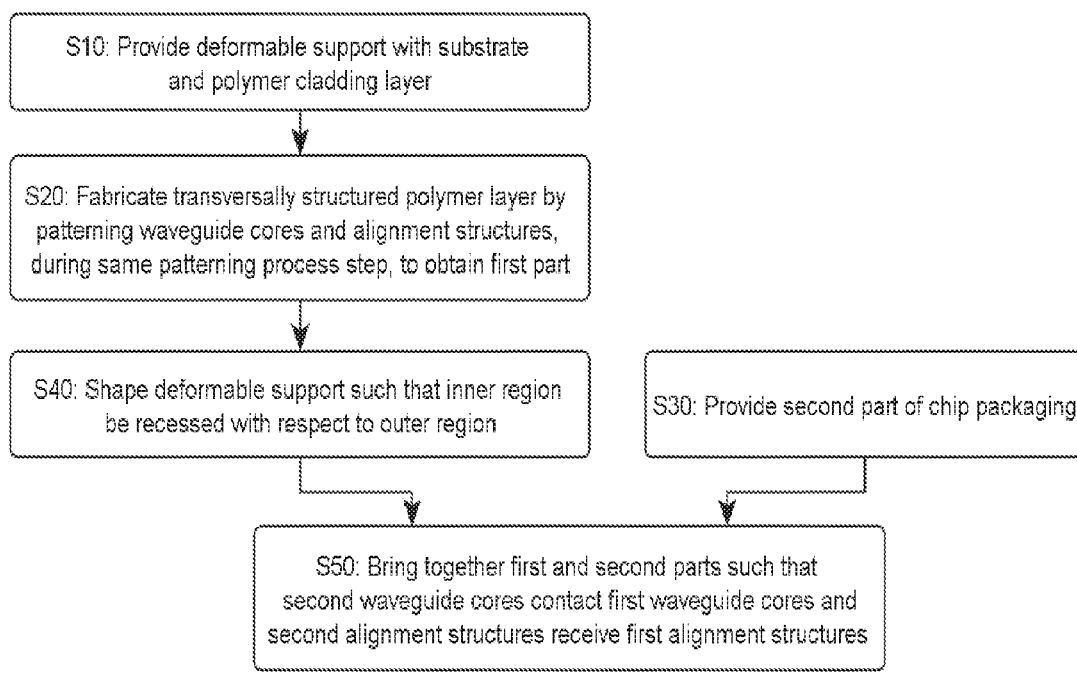
FIGS. 6 and 7 are flowcharts illustrating high-level steps of distinct passive alignment methods, according to embodiments.

Solutions as discussed above ensure good contact properties, even if (only) a passive alignment is used. This has advantages in terms of optical coupling. In that respect, and referring to FIG. 5, in embodiments, the first waveguide cores 142 and the second waveguide cores 242 may be configured so as to enable an adiabatic coupling between the first waveguide cores and the second waveguide cores. Adiabatic optical coupling is known per se. Adiabaticity condition is met when the optical distribution is defined by the same eigenmode (i.e., supermode) of the coupled waveguide system (e.g., fundamental even supermode, fundamental odd supermode) throughout the contact, with minimal scattering to other supermodes or radiation modes. Adiabaticity, however, is a relative term, as known; a coupler is considered to be adiabatic when the optical loss is below a predefined level, e.g. less than 15%, but typically less than 10%. Preferably, each of the second waveguide cores 242 exhibits a tapered portion 242*tp*. Such a structure is suited for optimal adiabatic optical coupling, while minimizing inter-waveguide optical coupling. The length of the taper portion shall typically be between 10 μm and 10 mm, which range of lengths allow for exceeding adiabaticity limits, in practice.

Preferred refractive index contrasts between the core waveguides and the cladding and filling materials may range between 0.001 and 0.01. The corresponding cross-sectional dimensions are on the order of 1 μm to 10 μm.

Referring now to FIGS. 1-3, and 6, another aspect of the invention is now described, which concerns a method for passively aligning two parts of a chip packaging such as depicted in FIGS. 1-3.

Such a method makes use S10-S30 a first part 10 and a second part 20, such as described earlier in reference to FIGS. 1-3. Namely, the first part comprises a deformable support 12 and a core polymer layer 14, structured so as to define waveguide cores 142 and alignment structures 144. The second part comprises the waveguide cores 242 and alignment structures 244.

At step S40, the deformable support is shaped so as for the inner region 16 to get recessed with respect to the outer region 18.

Finally, the first part 10 and the second part 20 are brought together S50 such that the second waveguide cores 242 respectively contact the first waveguide cores 142 and the one or more second alignment structures 244 respectively receive, at least partly, the one or more first alignment structures 144.

Step S40 (shaping the deformable support) can actually be started before actually providing S30 the second part 20. Step S50 (bringing the first and second parts together) can be done while shaping (e.g., urging) the deformable (e.g., flexible) support or otherwise constraining it to give it a desired shape.

In embodiments such as in FIG. 1, step S40 is carried out using a pre-formed vacuum chuck 30 with a recess 30*6* vis-à-vis the inner region 16, so as to obtain the inner region 16 recessed with respect to the outer region 18.

The specific embodiment of FIG. 1 exploits polymer waveguides on a flexible support 12 to obtain a suitable topography for the PWG-to-chip alignment. The pre-formed vacuum chuck facilitates the topography adaption required. More in detail, the polymer structures 142, 242 are processed on a flexible support 12 (steps S10-S30 in FIG. 6). The pre-formed vacuum chuck 30 has a recess 30*6*, structured so as to provide S40 the desired topography, whereby the polymer alignment features 144 can be brought S50 to a higher position than structures 142. The alignment of the SOI waveguides 242 relative to the polymer waveguides 142 is done by snapping the patterned alignment structures 144 into the complementary structures 244, the latter being realized in the buried oxide 24 and the Si handle 22. Step S40 and S50 can be partly concomitant. Once the alignment is realized, the PWG-Si photonics chip assembly 1 can be released S60 from the chuck 30.

In embodiments such as in FIG. 2, a carrier with features (e.g., copper pedestals) is used to provide the right topography. I.e., the deformable support 12 is applied S40 onto a rigid carrier 34, which comprises one or more protruding features 40 (e.g., two copper pedestals) arranged vis-à-vis the outer region 18. The protruding features 40 are structured and arranged such that applying the deformable support onto the rigid carrier 34 results in the inner region 16 being recessed with respect to the outer region 18.

In embodiments such as in FIG. 3, the deformable support 12*a* comprises one or more mechanical features 50 opposite to first alignment structures 144 (with respect to the deformable support 12). In the specific example of FIG. 3, the mechanical features 50 are realized as cladding patterns, processed on the backside of the flexible support 122. Thus, step S40 can now be carried out using a flat vacuum chuck 32. The flat vacuum chuck is used to provide support while assembling S50 the parts: the core polymer alignment features are brought to a higher position via the cladding patterns 50 on the backside of the flexible support. The alignment of the SOI waveguides relative to the polymer waveguides can again be achieved by snapping S50 patterned core polymer alignment structures into suitable complementary alignment structures realized in the buried oxide and Si handle. Once the alignment is realized, the PWG-Si photonic chip assembly 1*b* can be released from the chuck 32. Again, the polymer alignment features 144 are used directly as alignment features. The backside clad patterning can be suitably dimensioned so as for a lower edge of the backside clad patterns to be level with the recessed backside of the flexible portion 122.

The present methods may further include the fabrication of the polymer layer 14, e.g., by depositing the polymer layer onto the support and curing it. The transversally structured polymer layer 14 can be fabricated by patterning the waveguide cores 142 and alignment structures 144. Preferably, these structures 124, 144 are patterned during a same patterning process step. Although layer 14 implies a same resulting thickness for each the structures 124, 144, the recess of the inner region 16 as provided by the present solutions makes it possible to (at least partly) insert alignment structures 144 into their correspondingly shaped counterpart structures 244.

Figure 7:
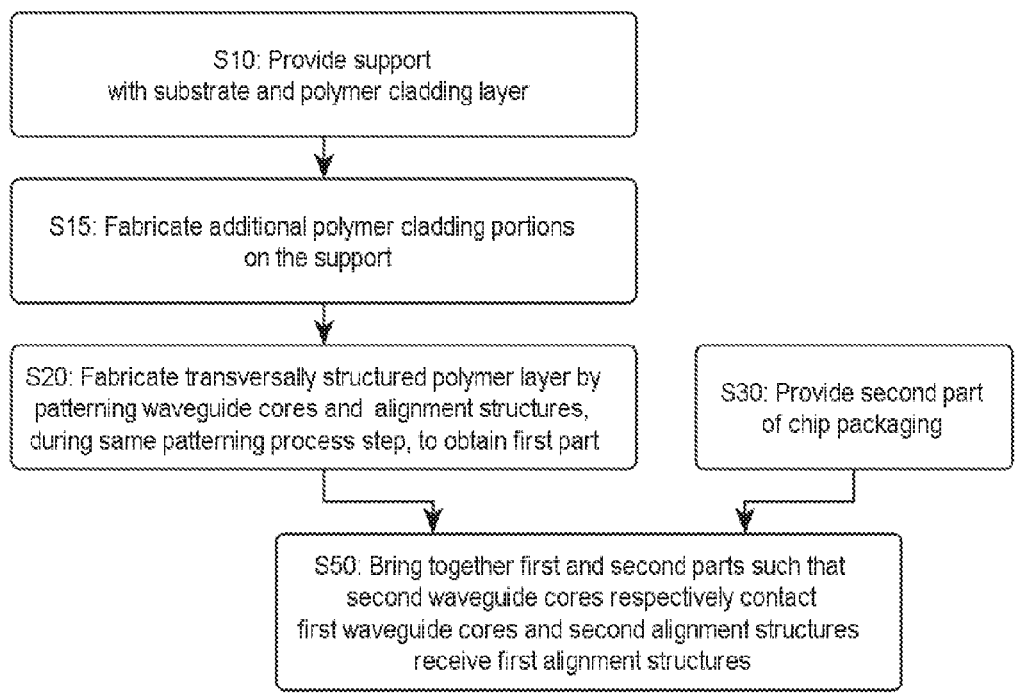

Referring now to FIGS. 4 and 7, another type of passive alignment is discussed, wherein the first part provided S10-S26 comprises a support 12 that is not necessarily deformable or flexible. A somewhat more sophisticated structure of the first part 10 may nevertheless ensure the desired recess of the inner region 16 with respect to the outer region 18. Thus, the first part and the second part can be brought S50 together such that the waveguide cores 242 respectively contact the waveguide cores 142, while alignment structures 244 respectively receive, at least partly, the alignment structures 144.

A suitable structure is for instance obtained by way of additional polymer cladding portions 125, e.g., pre-patterned lower cladding features, as illustrated in FIG. 4. The support initially provided S10 may comprise a support 122 and a polymer cladding layer 124 extending over the support 122. Then, additional polymer cladding portions 125 can be patterned S15, on the support. The cladding portions 125 obtained extend over the outer region 18 of the polymer cladding layer 124, so as to leave an inner region of the polymer cladding layer 124 exposed. This way, the desired recess is obtained.

After fabricating S15 the additional polymer cladding portions 125, one may fabricate S20 the transversally structured polymer layer. Step S20 may include depositing S22 a polymer layer 14 onto both the additional polymer cladding portions 125 and the exposed (inner) region of the polymer cladding layer 124. Then, the deposited polymer layer 14 can be transversally structured S24 and cured S26, to fix the waveguide cores 142 and alignment structures 144. Again, the waveguide cores 142 and alignment structures 144 are preferably patterned S24 during a same patterning process step.

The devices and methods described herein can notably be used in the fabrication of integrated circuit chips, optoelectronic chip packaging and silicon photonics chip packaging.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

The invention claimed is:

1. A chip packaging comprising a first part and a second part, wherein
   the first part comprises:
   a support;
   a core polymer layer extending over an inner region and an outer region of the support, the core polymer layer transversally structured so as to exhibit distinct residual portions, each having a same first height, which corresponds to a thickness of the core polymer layer, the residual portions comprising:
first waveguide cores disposed within said inner region,
one or more first alignment structures disposed within said outer region; and
wherein the support comprises one or more additional polymer cladding portions extending over a polymer cladding layer, the outer region defined on the one or more additional polymer cladding portions, so as for the inner region to be recessed with respect to the outer region;
the second part comprises:
second waveguide cores, each having a same second height; and
one or more second alignment structures complementarily shaped with respect to the one or more first alignment structures;
wherein the first part is structured such that said inner region is recessed with respect to the outer region, to enable:
the second waveguide cores to contact the first waveguide cores;
the one or more second alignment structures to respectively receive, at least partly, the one or more first alignment structures; and
wherein the inner region and the outer region are each planar and structurally contiguous.

2. A method for passively aligning two parts of a chip packaging, the method comprising:
providing a first part comprising:
a support;
a core polymer layer extending over an inner region and an outer region of the support, the core polymer layer transversally structured so as to exhibit distinct residual portions, each having a same first height, which corresponds to a thickness of the core polymer layer, the residual portions comprising:
first waveguide cores disposed within said inner region,
one or more first alignment structures disposed within said outer region; and
wherein the support comprises one or more additional polymer cladding portions extending over a polymer cladding layer, the outer region defined on the one or more additional polymer cladding portions, so as for the inner region to be recessed with respect to the outer region;
providing a second part comprising:
second waveguide cores, each having a same second height; and
one or more second alignment structures complementarily shaped with respect to the one or more first alignment structures;
wherein the first part is structured such that said inner region is recessed with respect to the outer region, to enable:
the second waveguide cores to contact the first waveguide cores;
the one or more second alignment structures to respectively receive, at least partly, the one or more first alignment structures; and
bringing together the first part and the second part such that the second waveguide cores respectively contact the first waveguide cores and the one or more second alignment structures respectively receive, at least partly, the one or more first alignment structures.

3. The method of claim 2, wherein providing the first part comprises:
depositing a core polymer layer onto both the one or more additional polymer cladding portions and an exposed inner region of the polymer cladding layer,
transversally structuring the deposited core polymer layer, and
curing the structured core polymer layer to obtain said first waveguide cores and said one or more first alignment structures.

4. The method of claim 3, wherein transversally structuring the core polymer layer comprises patterning said first waveguide cores and said one or more first alignment structures, during a same patterning process step.

* * * * *